United States Patent
Gupta et al.

(10) Patent No.: US 6,651,234 B2
(45) Date of Patent: Nov. 18, 2003

(54) PARTITION-BASED DECISION HEURISTICS FOR SAT AND IMAGE COMPUTATION USING SAT AND BDDS

(75) Inventors: Aarti Gupta, Princeton, NJ (US); Zijiang Yang, Plainsboro, NJ (US); Pranav Ashar, Belle Mead, NJ (US); Sharad Malik, Princeton, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/985,124

(22) Filed: Nov. 1, 2001

(65) Prior Publication Data

US 2002/0178424 A1 Nov. 28, 2002

Related U.S. Application Data

(60) Provisional application No. 60/281,793, filed on Apr. 6, 2001.

(51) Int. Cl.[7] .............................................. G06F 17/50
(52) U.S. Cl. .................................. 716/7; 716/4; 716/5
(58) Field of Search .............................. 716/4, 5, 7, 18; 706/45, 52, 14, 19

(56) References Cited

U.S. PATENT DOCUMENTS

| | | | | | |
|---|---|---|---|---|---|
| 5,680,518 A | * | 10/1997 | Hangartner | .................. | 706/52 |
| 6,026,222 A | * | 2/2000 | Gupta et al. | ..................... | 716/5 |
| 6,442,732 B1 | * | 8/2002 | Abramovici et al. | ........... | 716/4 |

* cited by examiner

Primary Examiner—Vuthe Siek
Assistant Examiner—Naum Levin
(74) Attorney, Agent, or Firm—Sughrue Mion, PLLC

(57) ABSTRACT

A method for Boolean Satisfiability (SAT). The method comprises using a variable decision heuristic in a SAT algorithm and pruning the search space of SAT using said decision heuristic. The decision heuristic is based on partitioning a conjunctive normal form (CNF) of a Boolean formula corresponding to the SAT and the partitioning is induced by a separator set. An image computaion method that uses the disclosed method for solving the SAT.

27 Claims, 4 Drawing Sheets

```
choose_separator_variable()
{
  max = 0;
  for (each column i) {
    set varsInL, varsInSep, varsInR;
    for (each row j) {
      if (all entries in j are to the left of i)
        varsInL = varsInL UNION (vars in row j);
      else if (all entries in j are to the right of i)
        varsInR = varsInR UNION (vars in row j);
      else
        varsInSep = varsInSep UNION (vars in row j);
    } // end of loop on j
    set PrivateVarsInL = varsInL - varsInSep;
    set PrivateVarsInR = varsInR - varsInSep;
    merit = (|PrivateVarsInL| * |PrivateVarsInR|) /
        |varsInSep|;
    if (merit > max) {
      max = merit;
      sep_var = i;
    }
  } // end of loop on i
  return sep_var;
}
```

FIG. 3

PARTITION-BASED DECISION HEURISTICS FOR SAT AND IMAGE COMPUTATION USING SAT AND BDDS

RELATED APPLICATIONS

This Application claims priority from co-pending U.S. Provisional Application Ser. No. 60/281,793, filed Apr. 6, 2001.

FIELD

This disclosure teaches novel techniques related to image computation. Specifically, techniques for decision heuristics for image computation using boolean satisfiability tests (SATs) and binary decision diagrams (BDDs) that are based on partitions are taught. The disclosed teachings are embodied in methods for image computation.

BACKGROUND

1. References

The following papers provide useful background information, for which they are incorporated herein by reference in their entirety, and are selectively referred to in the remainder of this disclosure by their accompanying reference numbers in square brackets (i.e., [3] for the third numbered paper by A Biere et al.):

[1] P. A. Abdulla, P. Bjesse, and N. Een. Symbolic reachability analysis based on SAT-solvers. In *Tools and Algorithms for the Analysis and Construction of Systems* (TACAS), 2000.

[2] E. Amir and S. McIlraith. Partition-based logical reasoning. In *Proc. 7th International Conference on Principles of Knowledge Representation and Reasoning*, 2000.

[3] A. Biere, A. Cimatti, E. M. Clarke, and Y. Zhu. Symbolic model checking without BDDS. In *Tools and Algorithms for the Analysis and Construction of Systems* (TACAS), volume 1579 of LNCS, 1999.

[4] R. K. Brayton et al. VIS: A system for verification and synthesis. In R. Alur and T. Henzinger, editors, *Proc. mt. Conf. on Comput.-Aided Verification*, volume 1102 of LNCS, pages 428–432, June 1996.

[5] R. E. Bryant. Graph-based algorithms for Boolean function manipulation. *IEEE Tran. on Comp.*, C-35(8):677–691, August 1986.

[6] J. Burch and V. Singhal. Tight integration of combinational verification methods. In *Proc. Int. Conf. on Comput.-Aided Design*, pages 570–576, 1998.

[7] J. R. Burch, E. M. Clarke, D. E. Long, K. L. McMillan, and D. L. Dill. Symbolic model checking for sequential circuit verification. *IEEE Tran. on CAD of Integrated Circ. and Sys.*, 13(4):401–424, Aprial 1994.

[8] G. Cabodi, P. Camurati, and S. Quer. Biasing symbolic search by means of dynamic activity profiles. In *Proc. Conference on Design Automation and Test Europe (DATE)*, March 2001.

[9] P. Chauhan, E. M. Clarke, S. Jha, J. Kukula, T. Shiple, H. Veith, and D. Wang. Non-linear quantification scheduling in image computation. In *Proc. Int. Conf. on Comput.-Aided Design*, November 2001.

[10] E. M. Clarke, O. Grumberg, and D. Peled. *Model Checking*. MIT Press, 1999.

[11] O. Coudert, C. Berthet, and J. C. Madre. Verification of synchronous sequential machines using symbolic execution. In *Proc. Int. Workshop on Automatic Verification Methods for Finite State Systems*, volume 407 of LNCS, pages 365–373. Springer-Verlag, June 1989.

[12] A. Gupta and P. Ashar. Integrating a Boolean satisfiability checker and BDDs for combinational verification. In *Proc. VLSI Design Conference*, January 1998.

[13] A. Gupta, Z. Yang, A. Gupta, and P. Ashar. SAT-based image computation with application in reachability analysis. In *Proc. Conference on Formal Methods in Computer-Aided Design*, November 2000.

[14] G. Karypis et al. hMETIS: Serial hypergraph and circuit partitioning. http://www-users.cs.umn.edu/~karypis/metis/hmetis.

[15] J. Kukula. When is SAT hard? Presented at Dagstuhl Seminar *Design and Test on BDDs versus SAT*, Schloss Dagstuhl, Germany, January 2001.

[16] T. Lengauer. *Combinatorial Algorithms for Integrated Circuit Layout*. John Wiley & Sons, England, 1990.

[17] J. P. Marques-Silva. *Search Algorithms for Satisfiability Problems in Combinational Switching Circuits*. PhD thesis, EEOS Department, University of Michigan, May 1995.

[18] J. P. Marques-Silva and A. L. Oliveira. Improving satisfiability algorithms with dominance and partitioning. In *IEEE/ACM International Workshop on Logic Synthesis*, May 1997.

[19] J. P. Marquez-Silva. Grasp package. http://algos.inesc.pt/~jpms/software.html.

[20] I.-H. Moon, G. Haclitel, and F. Somenzi. Border-block triangular form and conjunction schedule in image computation. In *Proc. Conference on Formal Methods in Computer-Aided Design*, November 2000.

[21] I.-H. Moon, J. Kukula, K. Ravi, and F. Somenzi. To split or to conjoin: The question in image computation. In *Proc. Design Automation Conf.*, pages 23–28, June 2000.

[22] M. Moskewicz, C. Madigan, Y. Zhao, L. Zhang, and S. Malik. Chaff: Engineering an efficient SAT solver. In *Proc. Design Automation Conf.*, June 2001.

[23] V. Paruthi and A. Kuehlmann. Equivalence checking combining a structural SAT-Solver, BDDs and simulation. In *Proc. Int. Conf on Comput. Design*, October 2000.

[24] M. R. Prasad, P. Chong, and K. Keutzer. Why is ATPG easy? In *Proc. Design Automation Conf.*, pages 22–28, 1999.

[25] R. K. Ranjan, A. Aziz, R. K. Brayton, B. F. Plessier, and C. Pixley. Efficient BDD algorithms for FSM synthesis and verification. In *International Workshop for Logic Synthesis*, May 1995. Lake Tahoe, Calif.

[26] M. Sheeran, S. Singh, and G. Stalmarck. Checking safety properties using induction and a SAT-Solver. In *Proc. Conference on Formal Methods in Computer-Aided Design*, November 2000.

[27] F. Somenzi et al. CUDD: University of Colorado Decision Diagram Package. mhttp://visi.colorado.eduefabio/CUDD/.

[28] H. Zhang. SATO: an efficient propositional prover. In *International Conference on Automated Deduction*, number 1249 in LNAI, pages 272–275, 1997.

2. Related Work

The Boolean satisfiability problem (SAT) has conventionally been used in many verification applications, such as equivalence checking [6, 12, 23], as well as model checking [1, 3, 26]. Combining SAT techniques with BDDs has also been conventionally shown to be effective for image computation with application in state reachability analysis of sequential circuits [13].

A typical implementation for solving SAT uses a branch-and-bound search over the values of all variables, with considerable sophistication in the software engineering of techniques for decision making, implication gathering, and back-tracking [19, 22, 28]. Since the SAT problem itself is NP-complete, the effectiveness of any algorithm for solving SAT depends upon the amount of pruning of the search space enabled by the SAT. In solving the SAT problem, decision heuristics are used to decide on the choice of which SAT variable to branch on at a given point in the solution. Such decision heuristics and their values, directly affect the amount of pruning.

Many SAT implementations use a Conjunctive Normal Form (CNF) representation of the Boolean formula associated with the SAT. This has led to the development of many decision heuristics based on the frequency of appearance of variables in unsatisfied (or all) clauses. In these decision heuristics, sometimes preference is given to smaller clauses in order to facilitate implications [17].

The present disclosure focuses on decision heuristics targeted at decomposing the overall problem into smaller, unrelated, partitions.

There have been some efforts in exploring the benefits of partitioning for generic SAT applications in CAD [18]. But, such efforts were restricted to the detection of partitions as they arise dynamically within the search, and no effort was made to actually derive such partitions. There has been some recent independent work on use of partitioning methods, including the use of separator-based partitioning, to improve the efficiency of the SAT solver [2]. However, this effort is not directly targeted at deriving good decision heuristics. In that work [2], the SAT problem is recursively partitioned into a tree of SAT subproblems using vertex separators as we do, but the manner in which they use the separators is completely different. Rather than deriving good decision heuristics based on the partitions, they find all solutions of each subproblem independently. Once all such solutions are found, they attempt to determine if any combination of solutions from each subproblem is consistent in terms of the values on the variables shared between subproblems. This is extremely inefficient when large SAT problems are being solved.

Along another related line, it has been conjectured that the degree of difficulty of a given SAT problem is related to the "information bandwidth" of the problem [15, 24]. That is, the greater the connectivity between variables, the more difficult is the problem likely to be. Again, this observation can be used to justify choosing decision variables that partition the problem into low bandwidth (or disjoint) partitions.

In terms of image computation itself, there have been many efforts aimed at exploiting circuit structure information for a pure BDD-based image computation [10]. For example, heuristics for clustering and ordering are based on analysis of shared variable support sets between next-state bit relations and the input state set [25]. In particular, Moon et al. proposed the MLP algorithm for a dependency matrix representation to obtain a Bordered Block Triangular form, which is particularly suited for deriving a good conjunction schedule [20]. They also identify existing connected components for decomposition, but again, there is no effort to actively derive such decompositions. Note that many of these heuristics capture the benefits of partitioning on the underlying circuit structure. However, none of these methods use SAT.

3. SAT-based Image Computation

Some background information on Image computation based on SAT is provided herein. Historically, symbolic state space traversal [7, 11] has relied on efficient algorithms based on BDDs [5] for carrying out an image computation, shown below:

$$Image(Y) = \exists_{X,W} T(X, W, Y) \cdot From(X) \quad (1)$$

Here, X/Y denote present/next state variables, respectively, W denotes primary input variables, T denotes the transition relation, and From denotes the input state set. BDDs are used to represent the characteristic function of the transition relation, as well as the input/image sets. As an example application, the set of reachable states can be computed by starting with a set From which denotes the set of initial states of a system, and using image computation iteratively, until a fixpoint is reached. The BDD-based approaches work well when it is possible to represent the sets of states and the transition relation (as a whole, or in a usefully partitioned form) using BDDs. Unfortunately, BDD size is very sensitive to the number of variables, variable ordering, and the nature of the logic expressions being represented.

Recently, an integration of SAT and BDDs has been proposed for image computation [13]. A pictorial representation of various features of this method is shown in FIG. 1. As shown in Part (a), state sets are represented by BDDs, and the transition relation is represented as a CNF formula. All image solutions over Y are enumerated using a backtracking search algorithm for SAT which operates over the CNF formula for T. Within this search, the BDD for From (X) is used as a constraint (called BDD Bounding), where any partial assignment over the X variables that does not satisfy From(X) leads to immediate backtracking within SAT.

As shown in Part (b), rather than using SAT to enumerate each solution all the way down to a leaf, BDD-based subproblems are invoked at intermediate points within the SAT search. This allows a symbolic, rather than explicit, enumeration of all solutions in the subtree rooted below that point. In a sense, this approach can be regarded as SAT providing a disjunctive decomposition of the image computation into many BDD subproblems. Each of the BDD subproblems involves a standard image computation as shown in Part (c), where the BDDs for the conjunctive partition are generated on-the-fly from unsatisfied clauses of the CNF for T.

A conventional method for image computation uses SAT search as a disjunctive decomposition of the overall search for image solutions into multiple subproblems, each of which is handled by using a standard BDD-based image computation algorithm [13]. In this context, SAT decision heuristics affect not only the pruning of the search space in SAT, but also the complexity of dynamically generated BDD subproblems.

The benefits of complementing a purely functional approach based on BDDs with structural information captured by SAT is crucial in improving performance of image computation. It will be advantageous to develop heuristics that improves the performance of reachability analysis, as well as helping in reaching more states than possible otherwise.

II. SUMMARY

The disclosed teachings are aimed at realizing some of the advantages noted above. According to an aspect of the disclosed techniques, there is provided a method for Boolean Satisfiability (SAT). The method comprising using a variable decision heuristic in a SAT algorithm; and pruning the search space of SAT using said decision heuristic. The decision heuristic is based on partitioning a conjunctive normal form (CNF) of a Boolean formula corresponding to the SAT and the partitioning is induced by a separator set.

Another aspect of the disclosed techniques is a method of image computation, wherein said image computation uses Boolean Satisfiability (SAT) and binary decision diagrams (BDD). The SAT is performed by a process comprising using a variable decision heuristic in a SAT algorithm; and pruning the search space of SAT using said decision heuristic. The decision heuristic is based on partitioning a conjunctive normal form (CNF) of a Boolean formula corresponding to the SAT and said partitioning is induced by a separator set.

In a specific improvement the decision heuristic is targeted at variables that dynamically result in partitioning a problem corresponding to the SAT into subproblems consisting of clauses with disjoint variable support.

In another specific improvement the partitioning is performed recursively on existing partitions whose sizes are above a threshold.

In still another specific improvement during the SAT preference is given to making decisions on separator variables.

In yet another specific improvement the partitioning is done using a dependency matrix.

More specifically, the rows of the dependency matrix contain conjunctive partitions and columns of the dependency matrix contains variable corresponding to said conjunctive partitions.

More specifically, a minimum number of clauses are considered for each gate such that all dependencies are captured.

More specifically, an additional row is added to the dependency matrix to denote dependency of an input set corresponding to the BDD to various variables.

More specifically, a column is selected from an active region of the matrix that intersects a maximum number of shortest rows, said column is moved to leftmost position and the active region is shrunk to exclude the selected column.

Still more specifically, rules are incorporated to break ties whenever there are multiple columns that can be moved to the left.

Even more specifically, the rule comprises giving preference to columns with a most number of entries in an inactive region.

In another specific improvement, the partitioning is done using a hypergraph partitioning technique.

More specifically, a CNF graph is used, where nodes denote clauses and hyperedges denote variables of formulae corresponding to the CNF.

More specifically, a node is added to the CNF graph to represent inputs of the BDD.

Still more specifically, each hyperedge is provided a weight that is equal to a number of nodes said each hyperedge connects to.

More specifically, a minimum-weight cutset of the graph is determined such that the cutset partitions the graph into unconnected components.

Still more specifically, the minimum weight cutset comprises hyperedges.

Still more specifically, a separator partition is defined as all clause that variables corresponding to hyperedges in the minimum weight cutset appear in.

In another specific improvement, wherein the partitioning results in a partition tree such that a size of each terminal partition is less than a threshold.

More specifically, the partition tree is used to assign a weight each to each variable in the CNF representation.

Still more specifically, the weight is used to rank variables.

More specifically, terminals corresponding to the separator are assigned a weight of 2 and other terminals are assigned a weight of 1.

More specifically, shared separator variables are give more preference that private separator variables.

Still more specifically, the preference is implemented by calculating a weight for a variable by adding contributions from each terminal partition that the variable appears in.

More specifically, the weight assigned to each terminal partition decreased according to increased depth from top of the partition tree.

More specifically, smaller partitions are given higher weight.

III. BRIEF DESCRIPTION OF THE DRAWINGS

The above objectives and advantages of the disclosed teachings will become more apparent by describing in detail preferred embodiments thereof with reference to the attached drawings in which:

FIG. 3 depicts an example pseude-code for implementing Separator selection using Dependency Matrix.

IV. DETAILED DESCRIPTION

IV.A. Synopsis

A decision heuristic for SAT, based on separator-set induced partitioning of the underlying CNF graph is disclosed. This technique uses separators instead of minimum cutsets for partitioning, because there exist small separators for graphs that do not have bipartitions with small cutsize [16]. The decision heuristic is targeted at those variables whose choice dynamically results in clause partitions with disjoint variable supports. Since disjoint subproblems contribute to search complexity additively, rather than multiplicatively, this heuristic can potentially improve performance in many applications of SAT, especially those where a large part of search space needs to be explored. Specifically, for the image computation problem, use of the disclosed decision heuristic in SAT, leads to simpler BDD subproblems. This is at least because BDD image computations with disjoint conjunctive partitions are less likely to blow up in size, in comparison to those with connected partitions.

It should be noted that the broader teachings of this disclosure are not limited to any specific kind of partitioning. While the disclosed technique can use any kind of partitioning, further improvements related to two specific methods for partitioning the CNF graph are disclosed. One kind of partitioning is generally related to the MLP (Minimal Lifetime Permutation) approach proposed by Moon et al. [20], and the other kind of partitioning is generally related to a standard hypergraph partitioning package called hMETIS [14]. Further improvements related to using the partition information to assign weights to all CNF variables, which can be combined with standard SAT decision heuristics, is also discussed in detail.

IV.B. CNF Partitioning

In this sub-section, techniques for image computation based on partition is discussed along with examples related to the two partitioning methods. Further, generation of the decision heuristic for SAT is discussed. The disclosed technique uses partitioning methods on a CNF formula to obtain a good separator. In this context, a separator is a set of clauses which separates the remaining clauses into two sets with no common variables. In other words, the entire set of clauses is partitioned into three sets; called left, right, and separator, such that the left and right partitions do not share any variables.

In the disclosed technique separators are use for partitioning, rather than using a minimum cutset, because there exist graphs which have a small separator, but do not have bipartitions with small cutsets [see generally, 16]. For example, a star graph with a central node connected to n other nodes, has a one-node separator, but an O(n) cutset. Furthermore, in the disclosed technique a recursive partitioning scheme is used, whereby any partition is considered for further re-partitioning if its size is above a certain threshold.

Figure 1:
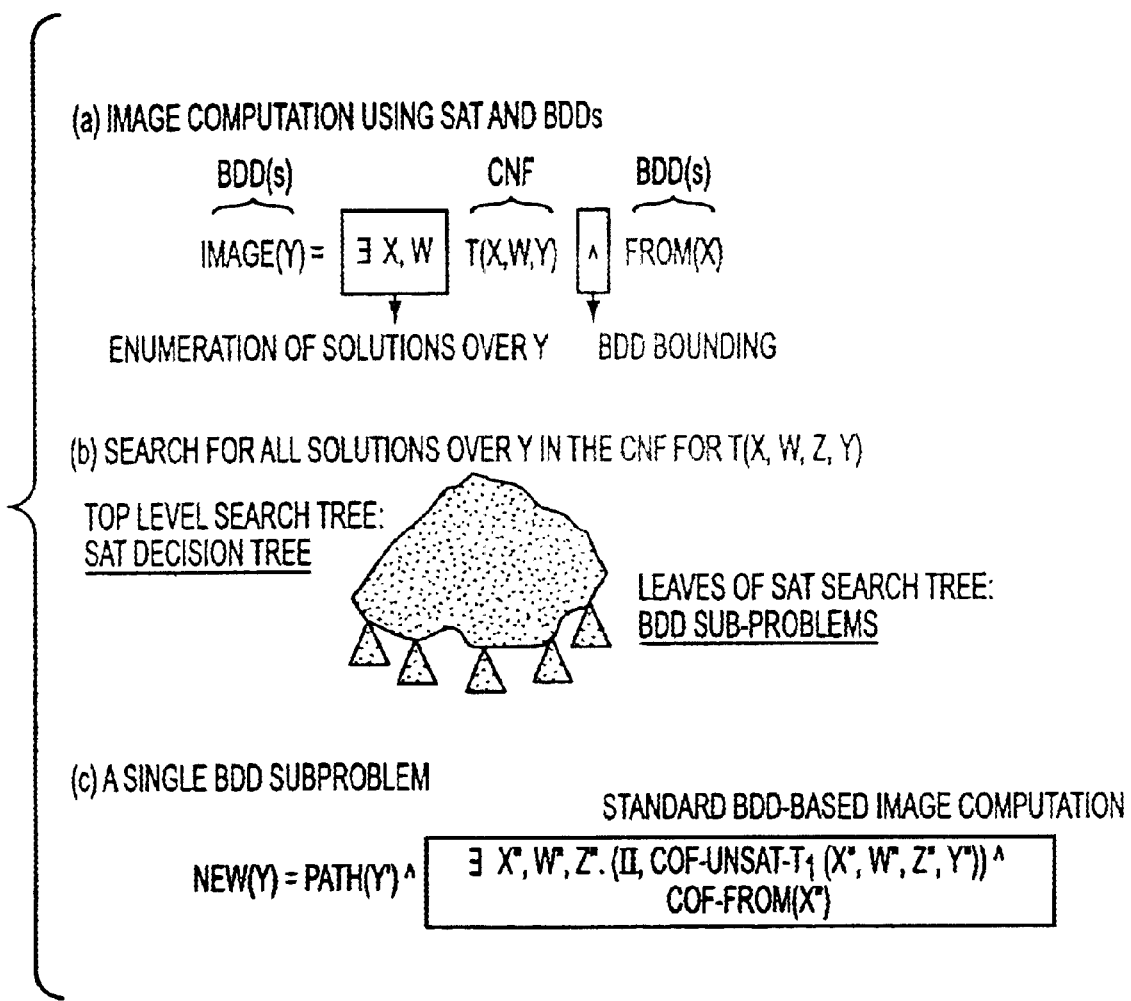
FIG. 1 depicts image computation using SAT and BDDs.
Figure 2:
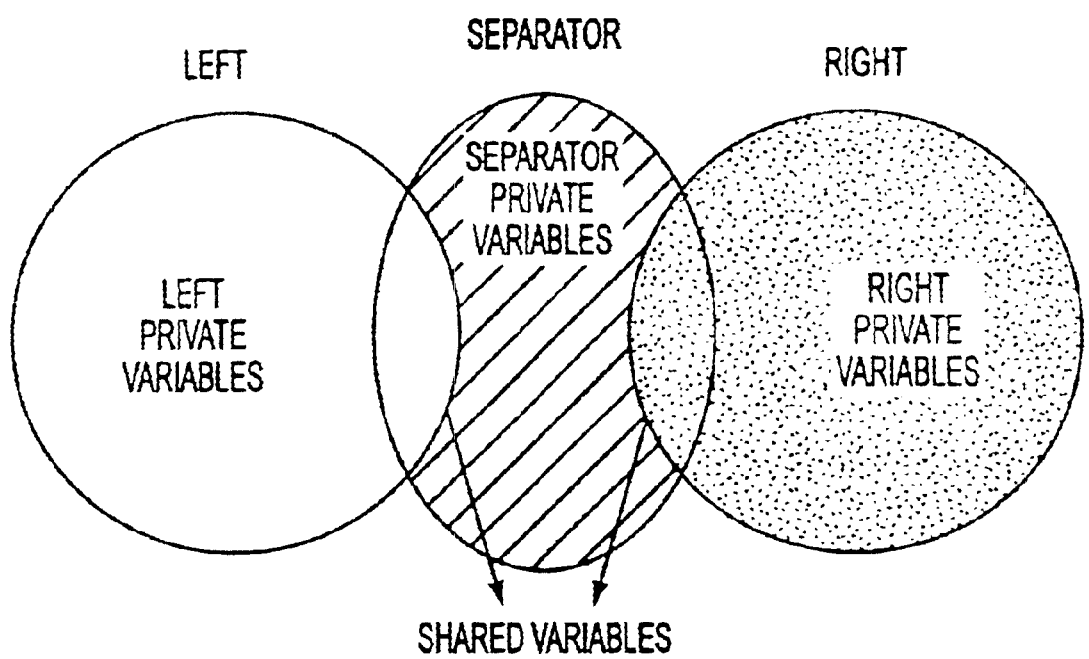
FIG. 2 depicts an illustration if variables in Clause Partition.

FIG. 2 shows an example of a partition. Note that a three-way partition of the set of clauses does not necessarily correspond to a partition of the support variables. This is shown pictorially for the general case in FIG. 2, which shows the shared and the private (non-shared) variables for each of the three clause partitions.

During SAT, preference is given to making decisions on the separator variables, in order that the remaining search can be performed over the disjoint left and right partitions. Note that it is sufficient, but not necessary to choose only shared variables in order to obtain partitions with disjoint variable supports. For example, it may be possible to assign values to private separator variables in order to satisfy all clauses in the separator partition. This still leads to the remaining problem being disjoint in terms of the left and right clause partitions.

The disclosed technique based on CNF partitioning takes into account not only the variable support sets, but also the constraints on their values, i.e. the clauses. This is in contrast to other approaches that may consider only variable support sets for partitioning.

1. Dependency Matrix Method

Further improvements in which the disclosed technique uses a partitioning method generally related to the work by Moon et al. [20], is discussed herein. In the partitioning technique of Moon, a dependency matrix representation of conjunctive partitions and their variable support sets are used. The rows represent the partitions while the columns represent the variable support sets. The rows and columns of this matrix are then permuted using the MLP algorithm to obtain a Bordered Block Triangular form. The active region of the matrix is acted on iteratively. A column is chosen, which intersects the maximum number of shortest rows. It is then moved it to the leftmost position. The active region is then shrunk to exclude it. This is repeated iteratively. This form is used to obtain a good conjunction schedule for purely BDD-based image computation.

In the disclosed technique a similar matrix representation for capturing the dependencies between clauses and variables of the CNF formula to be partitioned. Rows of the matrix represent the clauses and the columns represent variables. All CNF clauses are not used in representing the transition relation, since this sometimes would result in clauses from the same gate being in different partitions. Instead, only the minimum number of clauses is considered for each gate of the circuit such that all its variable dependencies are captured. Importantly, a row is added to denote the dependency of the input set BDD on various variables.

Next, the basic MLP algorithm proposed by Moon et al., is used with some modifications, to obtain the Bordered Block Triangular form. The modifications comprise the inclusion of several rules to break ties whenever there are multiple column candidates that can be moved to the left. In particular, preference is given to those columns with a higher "affinity" with the inactive region. Such columns with higher "affinity" will have with more number of entries in the inactive matrix.

Next, this matrix is used to choose a good separator. This is done by choosing a good separator variable, as shown in the pseudo-algorithm in FIG. 3. Basically, each variable (column) is considered as a candidate for separation, because it divides all clauses into three sets—those with all variables to its left, those with all variables to Its right, and those with variables both to its left and right. The last set of clauses is actually the separator set associated with this variable. The figure of merit, that is used to select such a variable, is targeted at maximizing the number of private variables in each of the left and right partitions, while minimizing the total number of variables in the separator itself. As noted earlier, the partitioning is performed recursively. The matrix-based separator algorithm is used at every level of the recursive partitioning scheme to yield three disjoint partitions of clauses at each level.

2. Graph Partitioning Method

The alternate improvement relates to a CNF partitioning method based on standard hypergraph partitioning techniques. The CNF graph that is considered consists of nodes denoting clauses, and hyperedges denoting variables of the CNF formula. The CNF formula that is used is the same as for the Dependency Matrix Method. Importantly, an additional node is added to the CNF graph denoting the input set BDD. The graph is weighted in such a way that each hyperedge has a weight equal to the number of nodes it connects. This, in turn, is equal to the number of clauses that the corresponding variable appears in.

Though polynomial time algorithms exist for finding minimum separators based on conventional maxflow-mincut network algorithms, the problem of finding separators which yield balanced partitions is NP-hard [for background information, see 16]. For partitioned CNF graphs, since the overall complexity of the SAT solver is affected by the sizes of the individual partitions as well, their main interest is in solving the latter problem. In this example, the latter problem is solved using a publicly available package called hMETIS [for background information on this package, see 14], which is known to perform well on practical problems. However, the hMETIS package cannot be used directly to find good separators. Instead, it is used to find a minimum-weight cutset of the given graph, where the cutset partitions the graph into unconnected components. The minimum-weight cutset consists of hyperedges, i.e. variables, and the separator partition is defined as all clauses that these variables appear in. Note that, while this is not equivalent to finding a good separator, minimizing the weights on the hyperedges lead to small separators. The variable support set of the separator clauses defines the set of separator variables, which can be larger than the set of cutset variables in general. By definition, the two node partitions defined by the cutset do not share any hyperedges, i.e. they correspond to the left and right partitions of clauses which do not share any common variables.

Again, the graph-partitioning algorithm is used at each level of the recursive partitioning scheme, such that each terminal partition is less than a certain threshold. For this reason, unbalanced partitions with up to a 25% unbalance factor are allowed. Using a higher unbalance factor is likely to result in many trivial terminal partitions.

3. Using Partitions for Decision Heuristics

The result of the partitioning performed above is a partition tree, in which the size of each terminal partition is less than a certain threshold. This partition tree is used to assign a weight to each variable in the CNF representation of the SAT problem. This partition-based weight is used as a multiplicative factor for the weight/rank computed for each variable using standard SAT heuristics, e.g. DLIS [for background information, see 19].

The weight assignment used in this example works as follows: The aim is to favor decisions on separator variables, in order that the remaining search can be performed over the disjoint left and right partitions. Therefore, in this particular example, separator terminals are assigned a weight of 2, and other terminals a weight of 1. Recall from FIG. 2 that some variables of the separator partition might be shared, while others are private. Again, more preference is given to shared separator variables, rather than private separator variables. This is because shared separator variable assignments are more likely to lead earlier to disjoint partitions. Therefore, for each variable, its weight is obtained by adding the contribution of each terminal partition that the variable appears in. This ensures that shared variables get more weight than non-shared variables.

Figure 4:
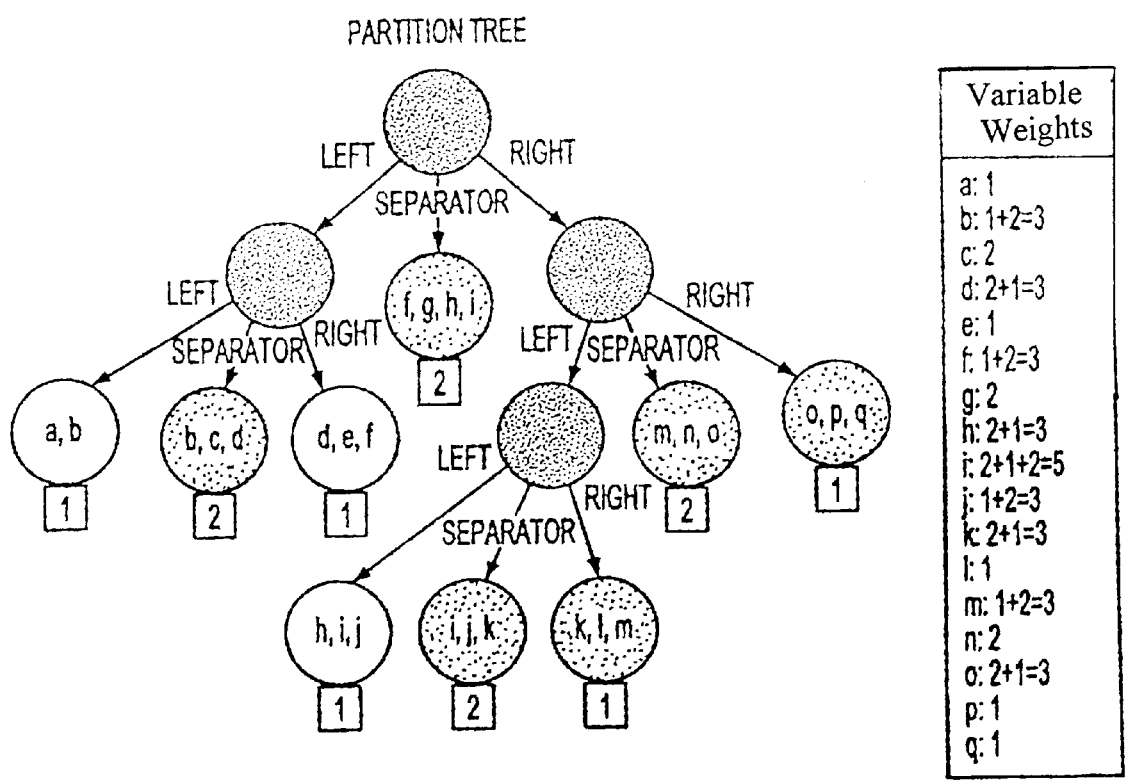
FIG. 4 shows an Example partition tree.

For example, consider the partition tree shown in FIG. 4, where all terminal partitions are labeled by the support variables, and the boxed numbers denote the weights assigned to the terminal partitions—weight 2 for separators, weight 1 otherwise. The resulting weight assignment for each variable is shown in the box to the right of the partition tree.

Alternative weight assignment strategies could also be used without deviating from the scope of the disclosed teachings. For example, the weight assigned to each terminal partition can be decreased according to increased depth from the top of the tree. In another case, the weight can be made to depend on the size of the partition, with smaller partitions being given higher weight, in order to achieve disjoint partitions as soon as possible in the SAT search. It has been found that the simple scheme described in the illustrated example works better than the alternate variations described in the previous paragraph.

IV.C. Experimental Results

There has been significant progress made in symbolic reachability analysis in recent years. The SAT-based image computations with and without the partition-based decision heuristic were compared to state of the art techniques in VIS [for background information on VIS, see 4], a conventional public domain tool. The prototype type implementation of the SAT-based image computation, discussed herein, uses the GRASP SAT solver [see 19] and the CUDD BDD package [see 27], and has been integrated within VIS. All reported illustrative experiments were run on an UltraSparc machine, with a 296 MHz processor, 1 GB memory. For most experiments a time limit of 100K seconds was used, and the CPU times indicated in the results tables are for the last reachability step completed within this time limit. For VIS, the default options in all experiments (partition threshold=5000, frontier method for building partition MDDS, iwls95 image method, and image cluster size=5000) were used. Dynamic variable reordering was enabled throughout all experiments, and good orders on the state and primary input variables (when available) were used initially. (Note that the SAT-based image computation requires additional ordering on the internal variables also, which appear in the CNF formula.)

1. Partitioning

Results of the two partitioning methods for some medium-sized ISCAS benchmark circuits are shown in Table 1. The name of the circuit appears in Column 1, and number of latches in Column 2 (marked #L). The number of CNF variables and clauses for representation of the entire transition relation are shown in Column 3 (marked #V/#C, respectively). Columns 4 through 7 show the results for the Dependency Matrix method—the depth of the partition

TABLE 1

| | | | Dependency Matrix Method | | | | Graph Partitioning Method | | | |
|---|---|---|---|---|---|---|---|---|---|---|
| Name | #L | CNF Size #V/#C | Tree Depth | #Tree Terminals | Biggest Size #v/#c | Time (s) | Tree Depth | # Tree Terminals | Biggest Size #v/#c | Time (s) |
| s1269 | 37 | 488/1308 | 6 | 11 | 181/342 | 2.7 | 3 | 7 | 174/282 | 1.5 |
| s1423 | 74 | 589/1494 | 6 | 13 | 189/345 | 4.1 | 4 | 9 | 155/205 | 1.7 |
| s3271 | 116 | 1273/3387 | 6 | 21 | 182/354 | 12.7 | 6 | 21 | 187/438 | 5.3 |
| s3330 | 132 | 885/2214 | 7 | 15 | 193/325 | 8.7 | 5 | 13 | 200/363 | 2.9 |
| s3384 | 183 | 1187/2853 | 7 | 21 | 217/456 | 9.7 | 6 | 17 | 239/154 | 3.1 |
| s4863 | 88 | 1887/5250 | 7 | 21 | 286/642 | 46.7 | 5 | 19 | 256/678 | 7.5 |
| prolog | 136 | 921/2322 | 7 | 13 | 193/242 | 9.5 | 4 | 11 | 192/259 | 2.8 |
| s5378 | 164 | 1234/3085 | 8 | 23 | 289/611 | 17.8 | 5 | 11 | 288/328 | 3.3 |
| s6669 | 231 | 2440/6302 | 8 | 27 | 280/669 | 55.0 | 7 | 23 | 297/188 | 9.4 |
| s9234.1 | 211 | 2316/6548 | 4 | 15 | 484/1012 | 38.6 | 5 | 15 | 445/725 | 9.8 |
| s13207.1 | 638 | 3464/8773 | 9 | 43 | 520/974 110.9 | 10 | 35 | 526/1159 | 16.2 | |

Partitioning Results for Benchmark Circuits

TABLE 2

| | Max | VIS (Standard) | | No Partition | | | SAT+BDD Image DM Method | | | GP Method | | | Improvement |
|---|---|---|---|---|---|---|---|---|---|---|---|---|---|
| Circuit | #Steps n | n | Time (s) | Peak (M) | n | Time (s) | Peak (M) | n | Time (s) | Peak (M) | n | Time (s) | Peak (M) | (more steps or speedup) |
| s1269 | 10(C) | 10 | 3269 | 6.7 | 10 | 2164 | 0.8 | 10 | 2000 | 1.5 | 10 | 1685 | 1.7 | 1.28 (GP) |
| s1423 | 15 | 11 | 8791 | 6.5 | 13 | 13151 | 12 | 15 | 24933 | 30.6 | 14 | 33013 | 17.2 | 2 more(DM) |
| s3271 | 17(C) | 17 | 17933 | 6 | 17 | 14036 | 1.4 | 17 | 9700 | 2.2 | 17 | 12791 | 2.4 | 1.45(DM) |
| s3330 | 9(C) | 9 | 20029 | 6 | 9 | 2029 | 1 | 9 | 4351 | 1.3 | 9 | 748 | 0.8 | 2.71 (GP) |
| s3384 | 7 | 4 | 24844 | 3.6 | 6 | 7801 | 0.5 | 6 | 3843 | 0.6 | 7 | 15307 | 2.9 | 1 more (GP) |
| s4863 | 5(C) | 3 | 3592 | 6 | 1 | 1014 | 0.6 | 5 | 39250 | 1.6 | 4 | 9488 | 0.7 | 4 more(DM) |
| prolog | 9(C) | 4 | 22099 | 5 | 9 | 4697 | 2.8 | 9 | 858 | 0.7 | 9 | 726 | 1.1 | 6.47 (GP) |
| s5378 | 45(C) | 8 | 57986 | 22.7 | 45 | 60547 | 2.6 | 45 | 95960 | 2.5 | 45 | 82644 | 1.6 | 0.73 (GP) |
| s6669 | 3 | 3 | 505 | 1 | 2 | 549 | 0.3 | 2 | 317 | 0.3 | 2 | 542 | 1.3 | 1.73(DM) |
| s9234.1 | 11 | 9 | 11577 | 7.6 | 9 | 22777 | 7.7 | 11 | 96455 | 17.3 | 9 | 15769 | 1.4 | 2 more(DM) |
| s13207.1 | 14 | 14 | 28600 | 7.5 | 10 | 8340 | 0.8 | 8 | 4910 | 0.8 | 11 | 13548 | 2.3 | 1 more (GP) |

Reachability Results for Benchmark Circuits tree, the number of terminal partitions, size of the biggest terminal partition (#v/#c), and the CPU time required for partitioning respectively. Columns 8 through 11 show corresponding results for the Graph Partitioning method. For these experiments, the input set BDD corresponds to the initial state set. For reachability analysis, CNF partitioning was performed dynamically at each iteration, taking into account the dynamically changing input set BDD.

As can be seen from Table 1, both partitioning methods are quite efficient in obtaining multi-depth partition trees for all benchmark circuits. In general, for the same threshold size constraint (different across circuits), the Graph Partitioning method (based on hMETIS) results in smaller depth trees, and less number of terminal partitions than the Dependency Matrix method. However, as results in the next section show, smaller depth trees did not always lead to improved results for reachability analysis.

2. Reachability Analysis

Results for reachability analysis on the benchmark circuits are shown in Table 2. The name of the circuit appears in Column 1. The maximum number of reachability steps completed by any of the four reported methods as shown in Column 2, where a "(C)" indicates that at least one method was able to complete the traversal, i.e. a fixpoint was reached. Columns 3, 4, and 5 show the number of steps completed (n), the CPU time (in seconds), and the Peak number of BDD nodes (in Millions) for standard VIS [4], which uses only BDDs for image computation. The remaining columns report the results for the SAT-based image computation that uses both SAT and BDDs. Columns 6, 7, and 8 report these numbers without the use of partition-based decision heuristic. Columns 9, 10, and 11 report these numbers with the use of partition-based decision heuristic using the Dependency Matrix (DM) method, while Columns 12, 13, and 14 report these numbers for the Graph Partitioning (GP) method using hMETIS. The CPU times reported include the time spent on obtaining the partition tree dynamically for each reachability step. Finally, the last column reports the improvement obtained by using the best partitioning method (DM or GP) in comparison to not using the partition-based decision heuristic at all. The improvement is reported either as an increase in the number of reachability steps, or as a speedup factor when the number of reachability steps completed are the same, i.e. (time without partition heuristic)/(time with partition heuristic).

Note from the last column of Table 2 that for all circuits, except s5378, the use of at least one partitioning method improves the performance of the SAT-based image computation in comparison to use of no partitioning method. The improvement in performance for the same number of steps is up to factor of 6, or more number of reachability steps are completed. For one circuit, s4863, the use of the GP method allowed a complete traversal, which could not be done earlier. In our experiments, the CPU times were dominated by the time needed to solve the BDD sub-problems. With the use of partition-based decision heuristics in SAT, these BDD sub-problems are considerably simplified because they consist of image computation over more loosely connected (sometimes disjoint) BDD relations. Therefore, these improvements clearly indicate the benefit of adding partition-based information in SAT for this application. Furthermore, both partitioning methods perform fairly well, each contributing to best improvement in about half of the circuits. At this time, more experiments could be done to better characterize which partition method is better suited for which kind of circuits (or partition trees).

In comparison to standard BDD-based image computation, note again from the table that SAT-based image computation is able to outperform standard VIS for many of the benchmark circuits, sometimes by an order of magnitude. The numbers for the peak BDD nodes clearly show the reduction in memory requirements with use of SAT for decomposition. However, for some of the larger circuits, such as s6669 and s13207.1, the SAT-based methods are not as good as VIS due to the larger number of variables in the CNF representation, in comparison to a BDD-based transition relation representation. However, there is scope for improvement in this direction by use of clustering to pre-quantify variables statically, and such methods are currently being explored.

Other researchers have also recently reported improvements for these benchmark circuits in comparison to standard VIS by use of better conjunction/ quantification schedules [for more information on these reports, see 9, 20, 21]. Since a target application for the disclosed teachings is image computation, pure breadth-first traversal has been used as a good indicator of its performance. It is likely that, similar to the many advances in BDD-based image computation (including sophisticated heuristics and better engineering), there will be further improvements in SAT-based image computation, which complements the benefits of BDDs by incorporating domain-specific knowledge through SAT.

3. Separator-set Induced Partitioning

It was noted in sub-section IV.B.2 that in the CNF graph partitioning method based on hMETIS, each hyperedge (denoting a CNF variable) has a weight, which represent the number of clauses the variable appears in. A minimum-weight cutset was then found hMETIS, and the separator partition was associated with all clauses that the cutset variables appeared in. A purpose was to minimize the number of clauses in the separator, and thereby potentially minimize the total number (shared and private) of separator variables. (There is no direct way to use hMETIS to find good separators.)

For comparison, hMETIS was also used without edge weights, i.e. all hyperedges are given a weight of 1. In this case, hMETIS again obtains minimum cutsets, but these do not necessarily correspond to good separators. This is because only the number of shared separator variables is minimized, with no effort to minimize either the number of separator clauses, or the total number of separator variables. Therefore, for the same size threshold for recursive partitioning, obtained different partition trees with no edge weights were obtained. These were then used in the same way as described earlier for computing decision heuristics in SAT.

The results for reachability analysis on some circuits using hMETIS with and without edge weights are shown in Table 3. In this table, Columns 2, 3, and 4 report the number of steps completed (n), the CPU time (in seconds), and the Peak number of BDD nodes (in Millions) for the hMETIS-based partitioning heuristic with edge weights, while Columns 5,6, and 7 report these numbers without edge weights. Note that in all circuits, the performance of reachability analysis suffers when hMETIS is used without edge weights. This highlights the benefit of using good separators for partitioning, instead of using minimum cutsets alone.

TABLE 3

| | With Edge Weights | | | Without Edge Weights | | |
|---|---|---|---|---|---|---|
| Circuit | n | Time (s) | Peak (M) | n | Time(s) | Peak(M) |
| s1269 | 10 | 1685 | 1.7 | 10 | 1985 | 1.7 |
| s3271 | 17 | 12791 | 2.4 | 13 | 25767 | 4.2 |
| s3330 | 9 | 748 | 0.8 | 9 | 3261 | 2.5 |
| prolog | 9 | 726 | 1.1 | 9 | 4925 | 1.4 |
| s4863 | 4 | 9488 | 0.7 | 4 | 32843 | 0.8 |
| s5378 | 45 | 82644 | 1.7 | 13 | 88690 | 2.0 |

Reachability Results for Partitioning with hMETIS

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method for Boolean Satisfiability (SAT), said method comprising:
   a) using a variable decision heuristic in a SAT algorithm; and
   b) pruning the search space of SAT using said decision heuristic,
      wherein said decision heuristic is based on partitioning a conjunctive normal form (CNF) of a Boolean formula corresponding to the SAT and said partitioning is induced by a separator set.

2. The method of claim 1, wherein said decision heuristic is targeted at variables that dynamically result in partitioning a problem corresponding to the SAT into subproblems consisting of clauses with disjoint variable support.

3. The method of claim 1, wherein said partitioning is performed recursively on existing partitions whose sizes are above a threshold.

4. The method of claim 1, wherein during the SAT preference is given to making decisions on separator variables.

5. The method of claim 1, wherein said partitioning is done using a dependency matrix.

6. The method of claim 5, wherein rows of said dependency matrix contain conjunctive partitions and columns of said dependency matrix contains variable corresponding to said conjunctive partitions.

7. The method of claim 6, wherein a minimum number of clauses are considered for each gate such that all dependencies are captured.

8. The method of claim 6, wherein an additional row is added to the dependency matrix to denote dependency of an input set corresponding to the BDD to various variables.

9. The method of claim 6, wherein a column is selected from an active region of the matrix that intersects a maximum number of shortest rows, said column is moved to leftmost position and the active region is shrunk to exclude the selected column.

10. The method of claim 9, wherein rules are incorporated to break ties whenever there are multiple columns that can be moved to the left.

11. The method of column 10, wherein said rule comprises giving preference to columns with a most number of entries in an inactive region.

12. The method of claim 1, wherein said partitioning is done using a hypergraph partitioning technique.

13. The method of claim 12, wherein a CNF graph is used, where nodes denote clauses and hyperedges denote variables of formulae corresponding to the CNF.

14. The method of claim 12, wherein a node is added to the CNF graph to represent inputs of the BDD.

15. The method of claim 13, wherein each hyperedge is provided a weight that is equal to a number of nodes said each hyperedge connects to.

16. The method of claim 12, wherein a minimum-weight cutset of the graph is determined such that the cutset partitions the graph into unconnected components.

17. The method of claim 16, wherein the minimum weight cutset comprises hyperedges.

18. The method of claim 17, wherein a separator partition is defined as all clause that variables corresponding to hyperedges in the minimum weight cutset appear in.

19. The methods of claim 1, wherein the partitioning results in a partition tree such that a size of each terminal partition is less than a threshold.

20. The method of claim 19, wherein the partition tree is used to assign a weight each to each variable in the CNF representation.

21. The method of claim 20, wherein the weight is used to rank variables.

22. The method of claim 20 wherein terminals corresponding to the separator are assigned a weight of 2 and other terminals are assigned a weight of 1.

23. The method of claim 22, wherein shared separator variables are give more preference that private separator variables.

24. The method of claim 23 wherein the preference is implemented by calculating a weight for a variable by adding contributions from each terminal partition that the variable appears in.

25. The method of claim 20, wherein the weight assigned to each terminal partition decreased according to increased depth from top of the partition tree.

26. The method of claim 20, wherein smaller partitions are given higher weight.

27. A method of image computation, wherein said image computation uses Boolean Satisfiability (SAT) and binary decision diagrams (BDD), said SAT is performed by a process comprising:
   a) using a variable decision heuristic in a SAT algorithm; and
   b) pruning the search space of SAT using said decision heuristic, wherein said decision heuristic is based on partitioning a conjunctive normal form (CNF) of a Boolean formula corresponding to the SAT and said partitioning is induced by a separator set.

* * * * *